(12) United States Patent
Shin et al.

(10) Patent No.: US 12,707,580 B2
(45) Date of Patent: Aug. 11, 2026

(54) ROLLABLE ELECTRONIC DEVICE COMPRISING WIRE STRUCTURE

(71) Applicant: Samsung Electronics Co., Ltd., Suwon-si (KR)

(72) Inventors: Wonho Shin, Suwon-si (KR); Junghoon Park, Suwon-si (KR); Joongkyung Park, Suwon-si (KR); Hyungsok Yeo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 70 days.

(21) Appl. No.: 18/784,154

(22) Filed: Jul. 25, 2024

(65) Prior Publication Data

US 2024/0381553 A1 Nov. 14, 2024

Related U.S. Application Data

(63) Continuation of application No. PCT/KR2022/018485, filed on Nov. 22, 2022.

(30) Foreign Application Priority Data

Jan. 25, 2022 (KR) ........................ 10-2022-0010956
Mar. 15, 2022 (KR) ........................ 10-2022-0032225

(51) Int. Cl.
*H05K 5/00* (2025.01)
*G06F 1/16* (2006.01)
*H05K 5/02* (2006.01)

(52) U.S. Cl.
CPC .................................. *H05K 5/0217* (2013.01)

(58) Field of Classification Search
CPC ............. H05K 5/0217; H04M 1/0268; H04M 1/0237; G06F 1/1624; G06F 1/1652; G09F 9/301; F16H 19/04; H02K 7/116
See application file for complete search history.

(56) References Cited

U.S. PATENT DOCUMENTS 9,860,353 B2 * 1/2018 Lee ........................ G06F 1/1652
10,209,742 B2 * 2/2019 Shin ...................... G06F 1/1624
(Continued)

FOREIGN PATENT DOCUMENTS

CN 111833743 A 10/2020
CN 212570228 U 2/2021
(Continued)

OTHER PUBLICATIONS

Extended European Search Report dated Mar. 24, 2025 issued in European Patent Application No. 22924342.3.
(Continued)

*Primary Examiner* — Rockshana D Chowdhury
(74) *Attorney, Agent, or Firm* — Nixon & Vanderhye P.C.

(57) ABSTRACT

According to various embodiments of the present disclosure, an electronic device comprises: a housing comprising a first housing and a second housing, the second housing accommodating at least part of the first housing and configured to move relative to the first housing; a display configured to be unfolded based on the sliding movement of the housing; a multi-bar structure comprising a plurality of rods which support at least part of the display; a motor structure comprising a motor disposed in the housing and configured to generate a driving force for the sliding movement of the housing; a gear structure comprising a pinion gear configured to rotate based on the driving force; and a wire structure comprising a wire connected to the multi-bar structure and the gear structure.

14 Claims, 12 Drawing Sheets

(56) References Cited

U.S. PATENT DOCUMENTS 10,321,583 B2 * 6/2019 Seo .......................... H04N 5/64
10,747,269 B1 * 8/2020 Choi ..................... G06F 1/1652
10,880,417 B1 12/2020 Song et al.
10,938,970 B1 * 3/2021 Lee ..................... H04M 1/0268
10,955,876 B1 * 3/2021 Song ..................... G06F 1/1652
11,003,219 B1 * 5/2021 Kim ...................... G06F 1/1652
11,315,447 B2 * 4/2022 Feng ..................... G06F 1/1652
11,480,241 B2 * 10/2022 Eom ......................... E06B 9/68
11,632,452 B2 * 4/2023 Delaporte ............... G09F 9/301
345/13
11,775,016 B2 * 10/2023 Choi ................... H04M 1/0237
361/679.01
11,864,334 B2 * 1/2024 Lee ....................... G06F 1/1601
11,914,423 B2 * 2/2024 Shin .................... H04M 1/0268
11,974,406 B2 * 4/2024 Lee ....................... G06F 1/1637
12,143,524 B2 * 11/2024 Kim .................... H04M 1/0262
12,181,937 B2 * 12/2024 Lee ....................... G06F 1/1686
2013/0058063 A1 * 3/2013 O'Brien ................ G06F 1/1624
361/807
2015/0009635 A1 * 1/2015 Kang ...................... G09F 19/02
361/749
2016/0324021 A1 * 11/2016 Takayanagi ........... G06F 1/1652
2019/0243424 A1 8/2019 Lee et al.
2019/0268455 A1 * 8/2019 Baek ..................... G06F 1/1652
2020/0033913 A1 * 1/2020 Yang .................. H04M 1/0268
2020/0212326 A1 * 7/2020 Eom ....................... F16H 55/22
2020/0315036 A1 10/2020 Ahn
2020/0363841 A1 11/2020 Kim et al.
2022/0021759 A1 1/2022 Lim et al.
2022/0155823 A1 5/2022 Shin et al.
2022/0232716 A1 7/2022 Lim et al.
2022/0253103 A1 * 8/2022 Choi ..................... G06F 1/1624
2022/0263932 A1 * 8/2022 Jo ....................... H04M 1/0268
2022/0308633 A1 * 9/2022 Yin ........................ G06F 1/1624
2023/0156105 A1 * 5/2023 Feng ................... H04M 1/0268
361/679.01
2023/0199980 A1 6/2023 Jiang
2023/0259168 A1 * 8/2023 Gu ........................ G06F 1/1624
2023/0283697 A1 * 9/2023 Kim .......................... G09F 9/30
455/575.4

FOREIGN PATENT DOCUMENTS

| | | | |
|---|---|---|---|
| CN | 113851040 | A | 12/2021 |
| JP | 2011034346 | A | 2/2011 |
| KR | 101182603 | B1 | 9/2012 |
| KR | 20160129669 | A | 11/2016 |
| KR | 20190062855 | A | 6/2019 |
| KR | 20190096026 | A | 8/2019 |
| KR | 20200115341 | A | 10/2020 |
| KR | 20200115941 | A | 10/2020 |
| KR | 20210143419 | A | 11/2021 |
| KR | 20210148396 | A | 12/2021 |
| WO | 2020209425 | A1 | 10/2020 |
| WO | 2021187641 | A1 | 9/2021 |
| WO | 2021193993 | A1 | 9/2021 |
| WO | 2021251679 | A1 | 12/2021 |
| WO | 2022014750 | A1 | 1/2022 |

OTHER PUBLICATIONS

International Search Report for PCT/KR2022/018485 dated Feb. 23, 2023, 5 pages.
Written Opinion of the ISA for PCT/KR2022/018485 dated Feb. 23, 2023, 6 pages.

* cited by examiner 202
221a
241
249b
241
223
221b
221c
211b
211c
211a
200
201
202
A2
211a
211b
211c
202
221b
249a
221c
101
A1
241
241
203
221a
203
201
211a
212
247b
221c
247a
243
202
202
241
241

ROLLABLE ELECTRONIC DEVICE COMPRISING WIRE STRUCTURE

CROSS-REFERENCE TO RELATED APPLICATIONS

This application is a continuation of International Application No. PCT/KR2022/018485 designating the United States, filed on Nov. 22, 2022, in the Korean Intellectual Property Receiving Office and claiming priority to Korean Patent Application Nos. 10-2022-0010956, filed on Jan. 25, 2022, and 10-2022-0032225, filed on Mar. 15, 2022, in the Korean Intellectual Property Office, the disclosures of each of which are incorporated by reference herein in their entireties.

BACKGROUND

Field

The disclosure relates to a rollable electronic device comprising a wire structure.

Description of Related Art

As information and communication technology and semiconductor technology have developed, various functions are being integrated into a single portable electronic device. For example, an electronic device may implement various functions, such as an entertainment function such as gaming, a multimedia function such as music/video playback, a communication and security function for mobile banking, and a function such as a schedule management or electronic wallet, as well as a communication function. Such electronic devices have been miniaturized to be conveniently carried by the user.

As mobile communication service is extended to include multimedia service, it is necessary to increase the size of the display of the electronic device in order to allow users to fully utilize the multimedia service. However, the size of the display of the electronic device is in a trade-off relationship with the miniaturization of the electronic device.

SUMMARY

According to various example embodiments of the disclosure, an electronic device may include: a housing including a first housing and a second housing configured to accommodate at least a portion of the first housing and to move relative to the first housing; a display configured to be unfolded based on a sliding movement of the housing; a multi-bar structure comprising a plurality of bars configured to support at least a portion of the display; a motor structure comprising a motor disposed in the housing and configured to generate a driving force for a sliding movement of the housing; a gear structure including a pinion gear configured to rotate based on the driving force; and a wire structure comprising a wire connected to the multi-bar structure and the gear structure.

According to various example embodiments of the disclosure, an electronic device may include: a second housing; a first housing configured to move relative to the second housing; a display configured to be unfolded based on a relative sliding movement of the first housing; a display support configured to support at least a portion of the display; a motor structure comprising a motor configured to generate a driving force for a relative movement of the first housing; a wire structure comprising a wire connected to the display support; and a gear structure including a gear configured to rotate based on the driving force, the gear structure including a first region connected to the wire structure and configured to rotate based on rotation of the motor structure and a second region including a pinion gear.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
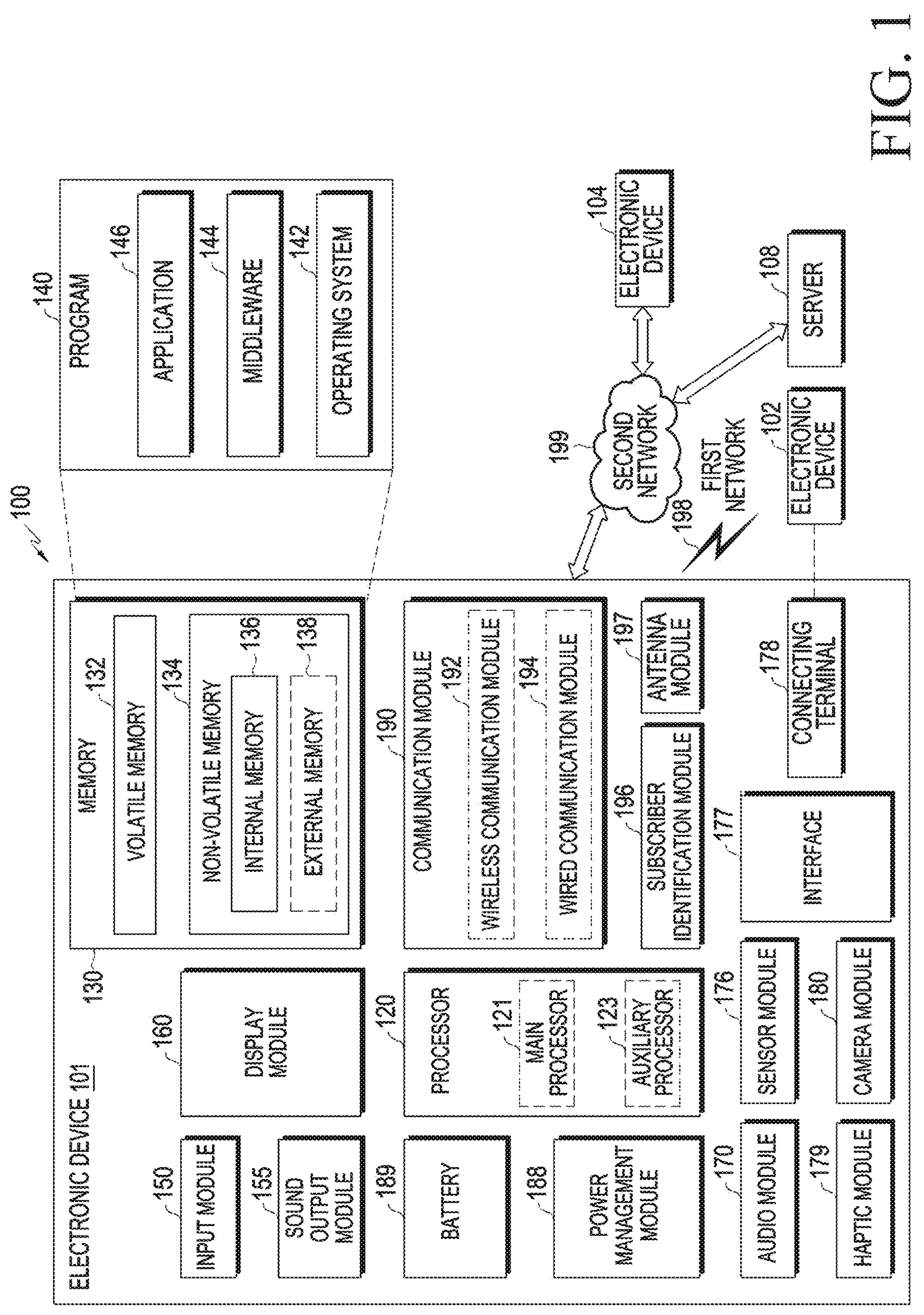
FIG. 1 is a block diagram illustrating an example electronic device in a network environment according to various embodiments.

FIG. 1 is a block diagram illustrating an example electronic device in a network environment according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may include various processing circuitry and/or multiple processors. For example, as used herein, including the claims, the term "processor" may include various processing circuitry, including at least one processor, wherein one or more of at least one processor, individually and/or collectively in a distributed manner, may be configured to perform various functions described herein. As used herein, when "a processor", "at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions. The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence model is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to an embodiment, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more external devices of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to an embodiment may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that an embodiment of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "Ist" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used in connection with an embodiment of the disclosure, the term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

According to an embodiment, each component (e.g., a module or a program) of the above-described components may include a single entity or multiple entities, and some of the multiple entities may be separately disposed in different components. According to an embodiment, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

Figure 2:
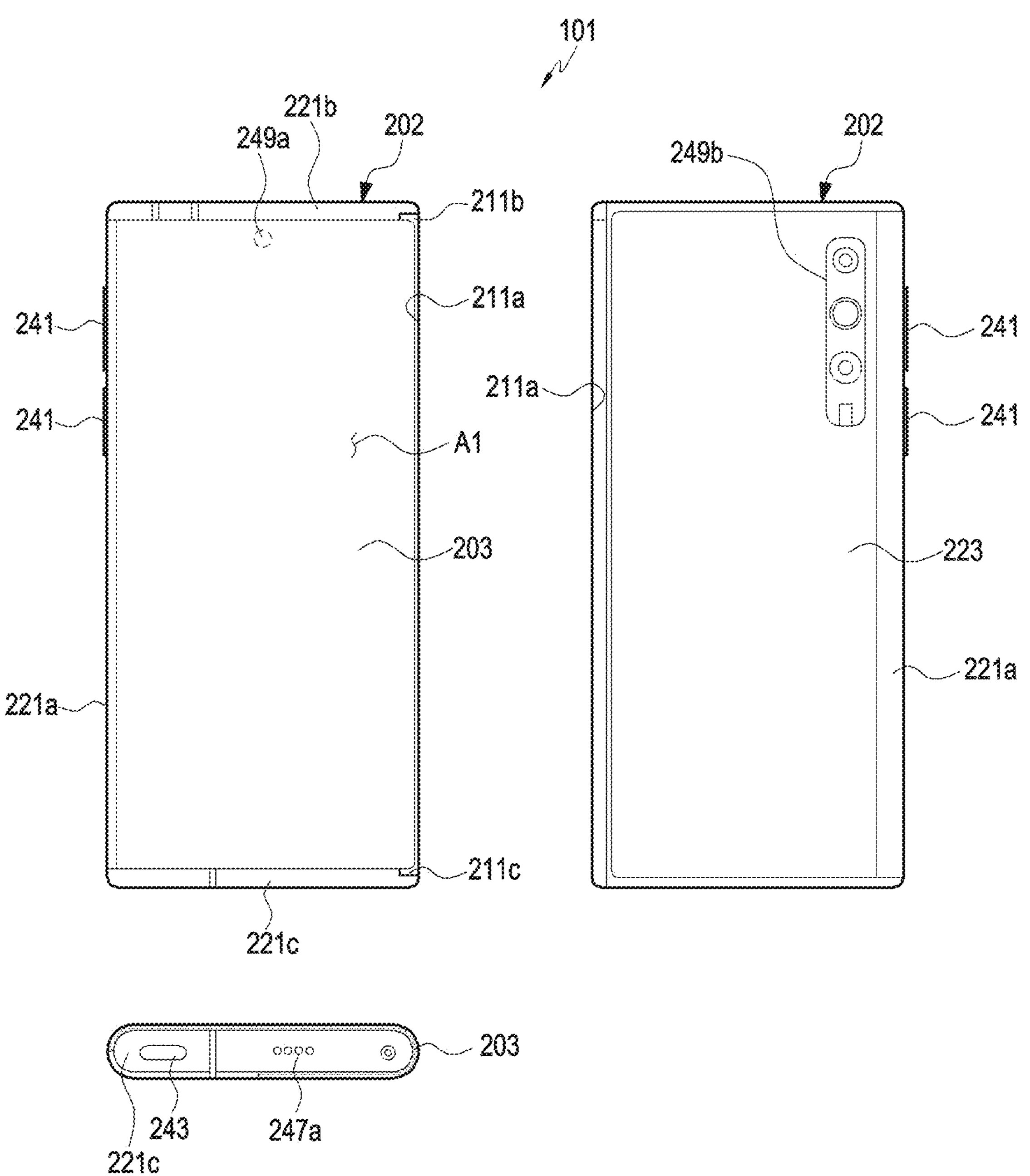
FIG. 2 is a diagram illustrating an electronic device in a closed state according to various embodiments.
Figure 3:
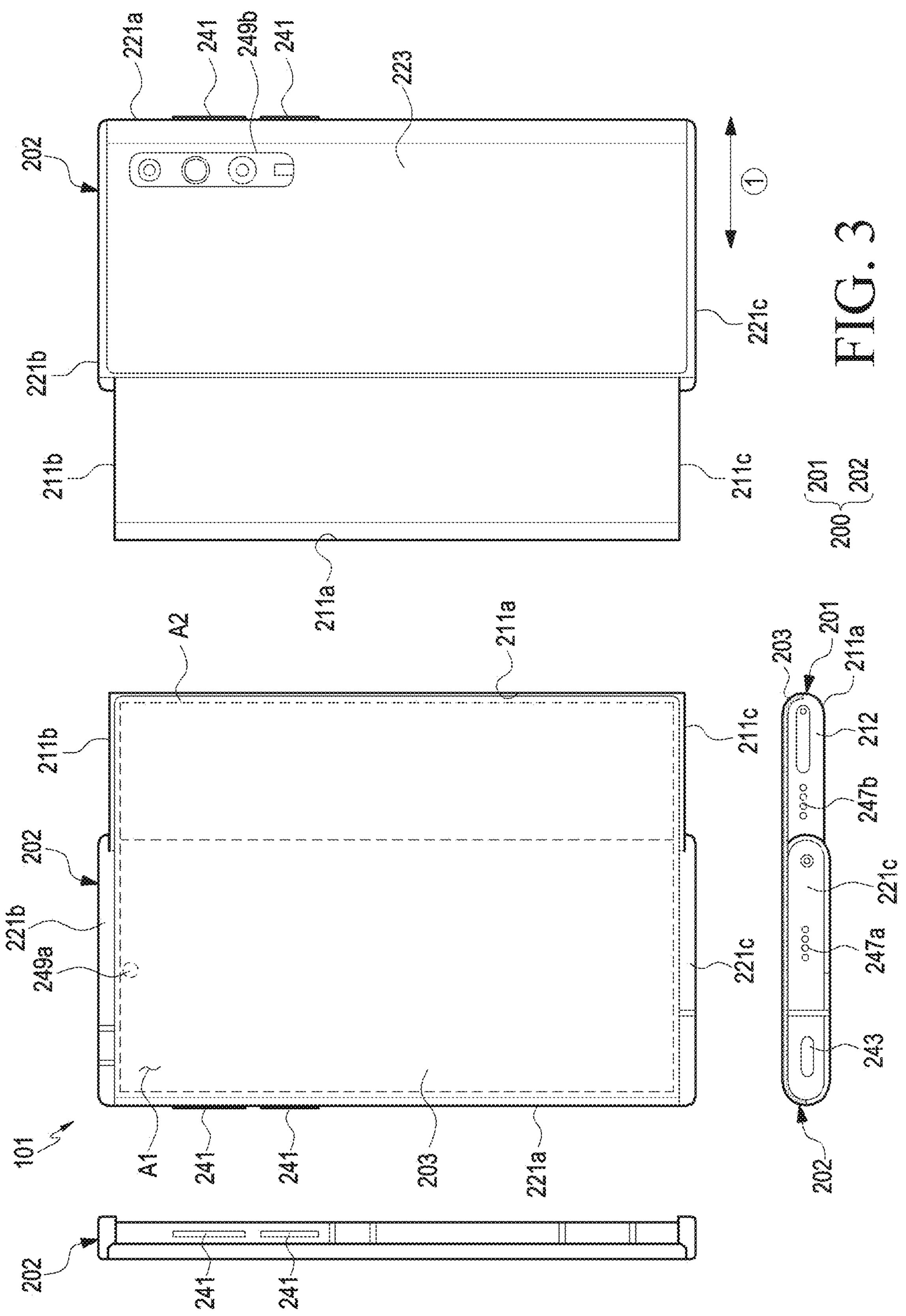
FIG. 3 is a diagram illustrating an electronic device in an open state according to various embodiments.

FIGS. 2 and 3 are diagrams illustrating an example electronic device according to various embodiments. FIG. 2 illustrates a first state (e.g., a closed state or a slide-in state) of an electronic device according to various embodiments. FIG. 3 illustrates a second state (e.g., an open state or a slide-out state) of an electronic device according to various embodiments.

The state illustrated in FIG. 2 may be a state in which the electronic device 101 and/or the housings 201 and 202 are closed, and the state illustrated in FIG. 3 may be a state in which the electronic device 101 and/or the housings 201 and 202 are open.

Referring to FIGS. 2 and 3, the electronic device 101 may include a housing 200. The housing 200 may include a second housing 202 and a first housing 201 disposed to be movable with respect to the second housing 202. In various embodiments, the electronic device 101 may be interpreted as having a structure in which the second housing 202 is slidably disposed with respect to the first housing 201. According to an embodiment, the first housing 201 may be disposed to perform a reciprocating motion by a predetermined distance in the direction illustrated with respect to the second housing 202, for example, in a direction indicated by arrow ①). The configuration of the electronic device 101 of FIGS. 2 and 3 may be entirely or partially the same as the configuration of the electronic device 101 of FIG. 1.

According to an embodiment, the first housing 201 may be referred to as a first structure, a slide portion, or a slide housing. The second housing 202 may be referred to as a second structure, a main portion, or a main housing. The second housing 202 may accommodate at least a portion of the first housing 201 and guide the sliding movement of the first housing 201. According to an embodiment, the second housing 202 may accommodate various electrical and electronic components, such as a main circuit board or a battery. According to an embodiment, at least a portion (e.g., the first display area A1) of the display 203 may be visually exposed to the outside of the housing 200. According to an embodiment, as the first housing 201 moves (e.g., slides) relative to the second housing 202, another portion (e.g., the second display area A2) of the display 203 may be accommodated (e.g., a slide-in operation) inside the second housing 202 or may be visually exposed (e.g., a slide-out operation) outside the second housing 202.

Figure 4:
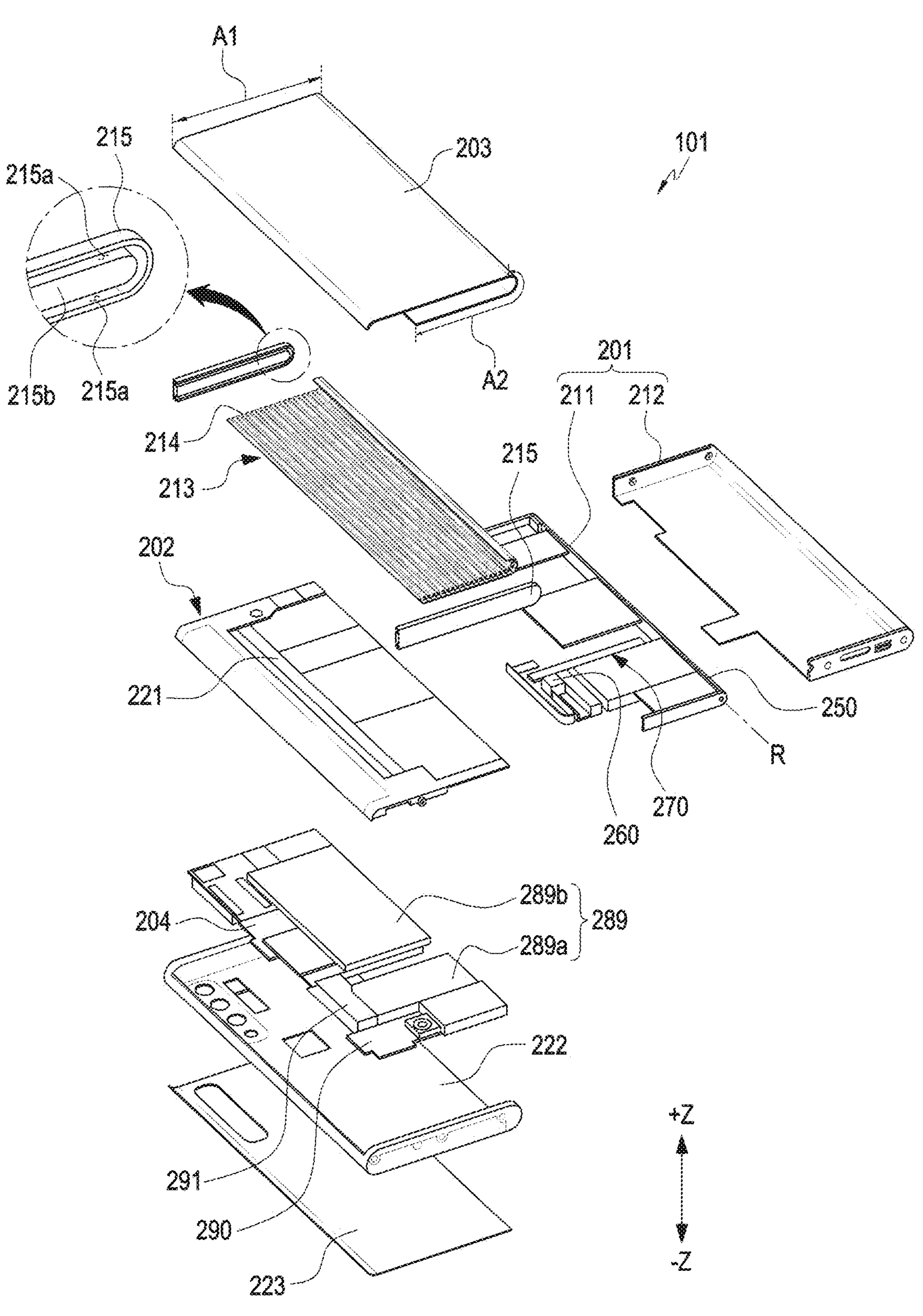
FIG. 4 is an exploded perspective view illustrating an electronic device according to various embodiments.

According to an embodiment, the first housing 201 may include first sidewalls 211*a*, 211*b*, and 211*c* for surrounding at least a portion of the display 203 and/or the display support member (e.g., the multi-bar structure 213 of FIG. 4). According to an embodiment, the first sidewalls 211*a*, 211*b*, and 211*c* may extend from a first plate (e.g., the first plate 211 of FIG. 4). The first sidewalls 211*a*, 211*b*, and 211*c* may include a 1-2th sidewall 211*b*, a 1-3th sidewall 211*c* opposite to the 1-2th sidewall 211*b*, and a 1-1th sidewall 211*a* extending from the 1-2th sidewall 211*b* to the 1-3th sidewall 211*c*. For example, the 1-2th sidewall 211*b* may be positioned above the electronic device 101, and the 1-3th sidewall 211*c* may be positioned below the electronic device 101. According to an embodiment, the 1-1th sidewall 211*a* may be substantially perpendicular to the 1-2th sidewall 211*b* and/or the 1-3th sidewall 211*c*. According to an embodiment, in the closed state (e.g., FIG. 2) of the electronic device 101, the 1-2th sidewall 211*b* may face the 2-2th sidewall 221*b* of the second housing 202, and the 1-3th sidewall 211*c* may face the 2-3th sidewall 221*c* of the second housing 202. According to an embodiment, the 1-1th sidewall 211*a*, the 1-2th sidewall 211*b*, and/or the 1-3th sidewall 211*c* may be integrally formed with the first plate (e.g., the first plate 211 of FIG. 4) or the slide cover 212. According to an embodiment, the 1-1th sidewall 211*a*, the 1-2th sidewall 211*b*, and/or the 1-3th sidewall 211*c* may be formed as separate housings and coupled to or assembled with each other.

According to an embodiment, the second housing 202 may include second sidewalls 221*a*, 221*b*, and 221*c* to surround at least a portion of the first housing 201. According to an embodiment, the second sidewalls 221*a*, 221*b*, and 221*c* may extend from a second plate (e.g., the second plate 221 of FIG. 4) and/or a cover member (e.g., the cover member 222 of FIG. 4). According to an embodiment, the second sidewalls 221*a*, 221*b*, and 221*c* may include a 2-2th sidewall 221*b*, a 2-3th sidewall 221*c* opposite to the 2-2th sidewall 221*b*, and a 2-1th sidewall 221*a* extending from the 2-2th sidewall 221*b* to the 2-3th sidewall 221*c*. For example, the 2-2th sidewall 221*b* may be positioned above the electronic device 101, and the 2-3th sidewall 221*c* may be positioned below the electronic device 101. According to an embodiment, the 2-1th sidewall 221*a* may be substantially perpendicular to the 2-2th sidewall 221*b* and/or the 2-3th sidewall 221*c*. According to an embodiment, the 2-2th sidewall 221*b* may face the 1-2th sidewall 211*b*, and the 2-3th sidewall 221*c* may face the 1-3th sidewall 211*c*. For example, in the closed state (e.g., FIG. 2) of the electronic device 101, the 2-2th sidewall 221*b* may cover at least a portion of the 1-2th sidewall 211*b*, and the 2-3th sidewall 221*c* may cover at least a portion of the 1-3th sidewall 211*c*.6

According to an embodiment, the second housing 202 may be formed in a shape such that one side (e.g., a front face) thereof is open to accommodate (or surround) at least a portion of the first housing 201. For example, the first housing 201 may be connected to the second housing 202 while being at least partially surrounded by the 2-1th sidewall 221*a*, the 2-2th sidewall 221*b*, and the 2-3th sidewall 221*c*, and may slide in the direction of arrow ① while being guided by the second housing 202. According to an embodiment, the cover member (e.g., the cover member 222 of FIG. 4), the 2-1th sidewall 221*a*, the 2-2th sidewall 221*b*, and/or the 2-3th sidewall 221*c* may be formed integrally. According to an embodiment, the second cover member 222, the 2-1th sidewall 221*a*, the 2-2th sidewall 221*b*, and/or the 2-3th sidewall 221*c* may be formed as separate housings and coupled to or assembled with each other.

According to an embodiment, the second housing 202 may include a rear plate 223. According to an embodiment, the rear plate 223 may form at least a portion of the exterior of the electronic device 101. For example, the rear plate 223 may provide a decorative effect on the exterior of the electronic device 101.

According to an embodiment, the electronic device 101 may include a display 203. The display 203 may be referred to as a flexible display or a rollable display. According to an embodiment, at least a portion (e.g., the second display area A2) of the display 203 may slide based on the sliding movement of the first housing 201. According to an embodiment, the display 203 may include or be disposed adjacent to a touch sensing circuit, a pressure sensor capable of measuring the intensity (pressure) of a touch, and/or a digitizer for detecting a magnetic-type stylus type. The configuration of the display 203 of FIGS. 2 and 3 may be entirely or partially the same as the configuration of the display module 160 of FIG. 1.

According to an embodiment, the display 203 may include a first display area A1 and a second display area A2. According to an embodiment, the first display area A1 may always be an area visible to the outside. According to an embodiment, the first display area A1 may be interpreted as an area that cannot be positioned inside the housing 200. According to an embodiment, the second display area A2 may extend from the first display area A1, may be inserted into or received in the second housing 202 as the first housing 201 slides or may be visually exposed to the outside of the second housing 202. According to an embodiment, the first display area A1 may be seated on a portion (e.g., the first plate 211) of the first housing 201.

According to an embodiment, the second display area A2 may move while being substantially guided by a display support member (e.g., the multi-bar structure 213 of FIG. 4) mounted in the first housing 201, and may be accommodated in the second housing 202 or in a space formed between the first housing 201 and the second housing 202, or may be visually exposed to the outside. According to an embodiment, the second display area A2 may move based on the sliding movement of the first housing 201 in a width direction (e.g., in the direction indicated by arrow ①). For example, at least a portion of the second display area A2 may be unfolded or rolled together with the multi-bar structure 213 based on the sliding movement of the first housing 201.

According to an embodiment, when viewed from above the first housing 201, as the first housing 201 moves from a closed state to an open state, the second display area A2 may be gradually exposed to the outside of the housing 202 to form a plane substantially together with the first display area A1. In an embodiment, the second display area A2 may be at least partially accommodated in the first housing 201 and/or the second housing 202.

According to an embodiment, the electronic device 101 may include at least one key input device 241, a connector hole 243, audio modules 247*a* and 247*b*, or camera modules 249*a* and 249*b*. Although not illustrated, the electronic device 101 may further include an indicator (e.g., an LED device) or various sensor modules. The configuration of audio modules 247*a* and 247*b* and the camera modules 249*a* and 249*b* of FIGS. 2 and 3 may be entirely or partially the same as the configuration of the audio module 170 and the camera module 180 of FIG. 1.

According to an embodiment, the key input device 241 may be positioned in an area of the second housing 202. Depending on the appearance and usage conditions, the electronic device 101 may be designed such that the illustrated key input device 241 is omitted, or additional key input device(s) are included. According to an embodiment, the electronic device 101 may include a key input device (not illustrated), for example, a home key button or a touch pad disposed around the home key button. According to an embodiment (not illustrated), at least a portion of the key input device 241 may be disposed on the second housing 202.

According to an embodiment, the key input device 241 may be used as a driving structure for providing slide-in/out operations of the display 203 automatically or semi-automatically. For example, if the user presses an open trigger button (e.g., the key input device 241 of FIG. 2) exposed to the outside of the electronic device 101, the display 203 may automatically slide in or out (automatic operation). As another example, if the user pushes the display 203 of the electronic device 101 up to a designated section to slide it out, the remaining section may be completely slide out by the force of an elastic member (not illustrated) mounted in the electronic device 101 (semi-automatic operation). For example, the state of the electronic device 101 may change from a closed state (e.g., as shown in FIG. 2) to an open state (e.g., as shown in FIG. 3) through this slide-out operation. The electronic device 101 may also perform a slide-in operation to correspond to the slide-out operation.

According to an embodiment, the connector hole 243 may be omitted in various embodiments, and may accommodate a connector (e.g., a USB connector) for transmitting and receiving power and/or data to and from an external electronic device. Although not illustrated, the electronic device 101 may include a plurality of connector holes 243, and some of the plurality of connector holes 243 may function as connector holes for transmitting and receiving audio signals to and from an external electronic device. In the illustrated embodiment, the connector hole 243 is disposed on the 2-3th sidewall 221*c*, but the disclosure is not limited thereto, and the connector hole 243 or a connector hole not illustrated may be disposed on the 2-1th sidewall 221*a* or the 2-2th sidewall 221*b*.

According to an embodiment, the audio modules 247*a* and 247*b* may include at least one speaker hole 247*a*, 247*b* and/or at least one microphone hole. At least one of the speaker holes 247*a* and 247*b* may be provided as an external speaker hole. At least one of the speaker holes 247*a* and 247*b* may be provided as a receiver hole for voice communication. The electronic device 101 may include a microphone for obtaining sounds, and the microphone may obtain sounds from the outside of the electronic device 101 through the microphone hole. According to an embodiment, the electronic device 101 may include a plurality of microphones to sense the direction of sounds. According to an embodiment, the electronic device 101 may include an audio module having speaker holes 247*a* and 247*b* and microphone hole implemented as a single hole, or may include a speaker (e.g., a piezo speaker) having no speaker hole.

According to an embodiment, the camera modules 249*a* and 249*b* may include a first camera module 249*a* (e.g., a front camera) and a second camera module 249*b* (e.g., a rear camera). According to an embodiment, the first camera module 249*a* may not be visually exposed to a screen display area (e.g., the first display area A1), and may include a hidden under display camera (UDC). The second camera module 249*b* may photograph a subject in a direction opposite to the first display area A1 of the display 203.

According to an embodiment, an indicator (e.g., an LED device) of the electronic device 101 may be disposed on the first housing 201 and/or the second housing 202, and may include a light emitting diode to provide state information of the electronic device 101 as a visual signal. The sensor module (e.g., the sensor module 176 of FIG. 1) of the electronic device 101 may generate an electrical signal or a data value corresponding to an internal operating state or an external environmental state of the electronic device 101. The sensor module may include, for example, a proximity sensor, a fingerprint sensor, or a biometric sensor (e.g., an iris/face recognition sensor or an HRM sensor). In an embodiment, the electronic device 101 may further include at least one of a gesture sensor, a gyro sensor, an atmospheric pressure sensor, a magnetic sensor, an acceleration sensor, a grip sensor, a color sensor, an infrared (IR) sensor, a temperature sensor, a humidity sensor, or an illuminance sensor. The configuration of the display 203, the audio modules 247*a* and 247*b*, and the camera modules 249*a* and 249*b* of FIGS. 2A and 2B may be entirely or partially the same as the configuration of the display module 160, the audio module 170, and the camera module 180 of FIG. 1.

FIG. 4 is an exploded perspective view illustrating an electronic device according to various embodiments.

Referring to FIG. 4, an electronic device 101 may include a first housing 201, a second housing 202, a display 203, and a multi-bar structure 213. A portion (e.g., the second display area A2) of the display 203 may be accommodated in the electronic device 101 while being guided by the multi-bar structure 213. The configuration of the first housing 201, the second housing 202, and the display 203 of FIG. 4 may be entirely or partially the same as the configuration of the first housing 201, the second housing 202, and the display 203 of FIGS. 2 and/or 3.

According to an embodiment, the first housing 201 may include a first plate 211 and a slide cover 212. The first plate 211 and the slide cover 212 may linearly reciprocate in one direction (e.g., in the direction of arrow ① in FIG. 3) while being guided by the second housing 202. According to an embodiment, the first plate 211 may slide with respect to the second housing 202 together with the slide cover 212. For example, at least a portion of the display 203 and/or at least a portion of the multi-bar structure 213 may be disposed between the first plate 211 and the slide cover 212.

According to an embodiment, the first plate 211 may support at least a portion of the display 203. For example, when the electronic device 101 is closed (e.g., FIG. 2), the first plate 211 may support at least a portion of the first display area A1, and when the electronic device 101 is open (e.g., FIG. 3), the first plate 211 may support at least a portion of the first display area A1 and at least a portion of the second display area A2. According to an embodiment, the first plate 211 may include a curved surface 250, and at least a portion of the second display area A2 of the display 203 may be positioned on the curved surface 250. According to an embodiment, the first plate 211 may be interpreted as a display support bar (DSB) or a display support plate (DSP).

According to an embodiment, the slide cover 212 may protect the display 203 positioned on the first plate 211. For example, the slide cover 212 may surround at least a portion of the display 203. At least a portion of the display 203 may be positioned between the first plate 211 and the slide cover 212. According to an embodiment, the first plate 211 and the slide cover 212 may be formed of a metal material and/or a nonmetal (e.g., polymer) material.

According to an embodiment, the first housing 201 may include a guide rail 215 (e.g., a guide structure). According to an embodiment, the guide rail 215 may be connected to the first plate 211 and/or the slide cover 212. For example, the guide rail 215 may slide with respect to the second housing 202 together with the first plate 211 and the slide cover 212.

According to an embodiment, the electronic device 101 may include a multi-bar structure 213. According to an embodiment, the multi-bar structure 213 may support the display 203. For example, the multi-bar structure 213 may be attached to the display 203. According to an embodiment, at least a portion of the display 203 and the multi-bar structure 213 may be positioned between the first plate 211 and the slide cover 212. According to an embodiment, as the first housing 201 slides, the multi-bar structure 213 may move relative to the second housing 202. In a closed state (e.g., FIG. 2), the multi-bar structure 213 may be mostly accommodated within the second housing 202. According to an embodiment, at least a portion of the multi-bar structure 213 may move in correspondence to a curved surface 250 positioned on the edge of the first plate 211.

According to an embodiment, the multi-bar structure 213 may include a plurality of rods 214 (or bars). The plurality of rods 214 may be linearly extended and disposed parallel to the axis of rotation R formed by the curved surface 250, and may be arranged in a direction perpendicular to the axis of rotation R (e.g., in the direction in which the first housing 201 slides).

According to an embodiment, each rod 214 may pivot around another adjacent rod 214 while remaining parallel with the other adjacent rod 214. According to an embodiment, as the first housing 201 slides, the plurality of bars 214 may be arranged to form a curved shape or may be arranged to form a planar shape. For example, as the first housing 201 slides, a portion of the multi-bar structure 213 facing the curved surface 250 may form a curved surface, and another portion of the multi-bar structure 213 that does not face the curved surface 250 may form a flat surface. According to an embodiment, the second display area A2 of the display 203 may be mounted or supported on the multi-bar structure 213, and in the open state (e.g., FIG. 3), at least a portion of the second display area A2, along with the first display area A1, may be exposed to the outside of the second housing 202. In a state in which the second display area A2 is exposed to the outside of the second housing 202, the multi-bar structure 213 may support or maintain the second display area A2 in a flat state by forming a substantially flat surface. According to an embodiment, the multi-bar structure 213 may be replaced with a bendable integral support member (not shown). According to an embodiment, the multi-bar structure 213 may be interpreted as a display support member, a display support multi-bar, or an articulated hinge structure.

According to an embodiment, the guide rail 215 may guide the movement of the plurality of rods 214. According to an embodiment, the guide rail 215 may include an upper guide rail adjacent to the 1-2th sidewall (e.g., the 1-2th sidewall 211*b* of FIG. 3) and a lower guide rail adjacent to the 1-3th sidewall (e.g., the 1-3th sidewall 211*c* of FIG. 3).

According to an embodiment, the guide rail 215 may include a groove-shaped rail 215*a* formed inside the guide rail 215 and a protrusion 215*b* positioned inside the guide rail 215. At least a portion of the protrusion 215*b* may be surrounded by the rail 215*a*. According to an embodiment, the multi-bar structure 213 may be positioned between the upper guide rail and the lower guide rail, and may move while remaining engaged with the upper and lower guide rails. For example, the upper and/or lower portions of the plurality of rods 214 may slide along the rail 215*a* while fitted into the rail 215*a*.

According to an embodiment, when the electronic device 101 is opened (e.g., a slide-out operation), the size of the area where the display 203 is exposed to the outside may increase. For example, by the driving of the motor structure 260 (e.g., driving for sliding out the display) and/or an external force provided by the user, the first plate 211 connected to the motor structure 260 may slide out, and the protrusion 215*b* inside the guide rail 215 may push the upper and/or lower ends of the plurality of rods 214. Accordingly, the display 203 accommodated between the first plate 211 and the slide cover 212 may be expanded to the front.

According to an embodiment, when the electronic device 101 is closed (e.g., a slide-in operation), the size of the area where the display 203 is exposed to the outside may be reduced. For example, by driving of the motor structure 260 (e.g., driving for sliding in the display) and/or an external force provided by the user, the first plate 211 where the motor is disposed may slide-in, and the outer portion (e.g., a portion other than the protrusion 215*b*) of the guide rail 215 may push the upper and/or lower ends of the plurality of rods 214. Accordingly, the expanded display 203 may be accommodated between the first plate 211 and the slide cover 212.

According to an embodiment, the second housing 202 may include a second plate 221, a cover member 222, and a rear plate 223. According to an embodiment, the second plate 221 may support at least a portion (e.g., the first display area A1) of the display 203. The first plate 221 may be disposed between the display 203 and the circuit board 204. According to an embodiment, the cover member 222 may accommodate components (e.g., the battery 289 (e.g., the battery 189 of FIG. 1) and the circuit board 204) of the electronic device 101, and may protect the components of the electronic device 101. According to an embodiment, the cover member 222 may be referred to as a book cover.

According to an embodiment, a plurality of circuit boards may be accommodated in the second housing 202. A processor, memory, and/or an interface may be mounted on the circuit board 204 which is the main board. The processor may include, one or more of, for example, a central processing unit, an application processor, a graphic processing device, an image signal processor, a sensor hub processor, or a communication processor. According to an embodiment, the circuit board 204 may include a flexible printed circuit board type radio frequency cable (FRC). For example, the circuit board 204 may be disposed in the cover member 222 and may be electrically connected to an antenna module (e.g., the antenna module 197 of FIG. 1) and a communication module (e.g., the communication module 190 of FIG. 1).

According to an embodiment, the memory may include, for example, a volatile or non-volatile memory.

According to an embodiment, the interface may include, for example, a high definition multimedia interface (HDMI), a universal serial bus (USB) interface, a SD card interface, and/or an audio interface. The interface may electrically or physically connect, e.g., the electronic device 101 with an external electronic device and may include a USB connector, an SD card/multimedia card (MMC) connector, or an audio connector.

According to an embodiment, the electronic device 101 may further include a separate sub-circuit board 290 spaced apart from the circuit board 240 in the second housing 202. The sub-circuit board 290 may be electrically connected to the circuit board 240 through the flexible circuit board 291. The sub-circuit board 290 may be electrically connected to electrical components disposed in an end of the electronic device 101, such as the battery 289, a speaker, and/or a SIM socket, and may transfer signals and power.

According to an embodiment, the battery 289, which is a device for supplying power to at least one component of the electronic device 101, may include, for example, a primary cell which is not rechargeable, a secondary cell which is rechargeable, or a fuel cell. At least a portion of the battery 289 may be disposed on substantially the same plane as the circuit board 204, for example. The battery 289 may be integrally disposed inside the electronic device 101 or may be detachably disposed with the electronic device 101.

According to an embodiment, the battery 289 may be formed as a single integrated battery or may include a plurality of removable batteries (e.g., the first battery **289*a* and the second battery 289*b*). According to an embodiment, when the integrated battery is positioned on the first plate 211, the integrated battery may move together with the sliding of the first plate 211. According to an embodiment, when the integrated battery is positioned on the second plate 221, the integrated battery may be fixedly disposed on the second plate 221 regardless of the sliding of the first plate 211. As another example, when the first battery 289*a* of the removable batteries is positioned on the first plate 211 and the second battery 289*b* of the removable batteries is fixedly positioned on the second plate 221, only the first battery 289*a* may move together with the sliding of the first plate 211**.

According to an embodiment, the rear plate 223 may substantially form at least a portion of the exterior of the second housing 202 or the electronic device 101. For example, the rear plate 223 may be coupled to the outer surface of the cover member 222. According to an embodiment, the rear plate 223 may be integrated with the cover member 222. According to an embodiment, the rear plate 223 may provide a decorative effect on the exterior of the electronic device 101. The second plate 221 and the cover member 222 may be manufactured using at least one of metal or polymer, and the rear plate 223 may be manufactured using at least one of metal, glass, synthetic resin, or ceramic. According to an embodiment, the second plate 221, the cover member 222, and/or the rear plate 223 may be made of a material that transmits light at least partially (e.g., an auxiliary display area). For example, in a state in which a portion (e.g., the second display area A2) of the display 203 is accommodated in the electronic device 101, the electronic device 101 may output visual information using the second display area A2. The auxiliary display area may be a portion of the second plate 221, the cover member 222, and/or the rear plate 223 in which the display 203 accommodated in the second housing 202 is positioned.

According to an embodiment, the electronic device 101 may include a motor structure 260 and a gear assembly 270 for sliding of the electronic device 101. The motor structure 260 may include a motor core for generating power. The gear assembly 270 may receive at least a portion of the driving force generated by the motor structure 260 and may move and/or rotate accordingly. The first housing 201 may receive at least a portion of the driving force generated by the motor structure 260 through the gear assembly 270 and may be moved relative to the second housing 202.

The electronic device 101 illustrated in FIGS. 2, 3 and 4 (which may be referred to as FIGS. 2 to 4) has a rollable or slidable appearance, but the disclosure is not limited thereto. According to an embodiment (not illustrated), at least a portion of the electronic device illustrated may be rolled in a scroll shape.

Referring to FIGS. 2 to 4, when viewed from the front of the electronic device 101, the display 203 may be expanded in the rightward direction of the electronic device 101. However, the structure of the electronic device 101 is not limited thereto. For example, according to an embodiment, the display 203 may be extended in the leftward direction of the electronic device 101. According to an embodiment, the display 203 may be extended in the longitudinal direction of the electronic device 101.

Figure 5:
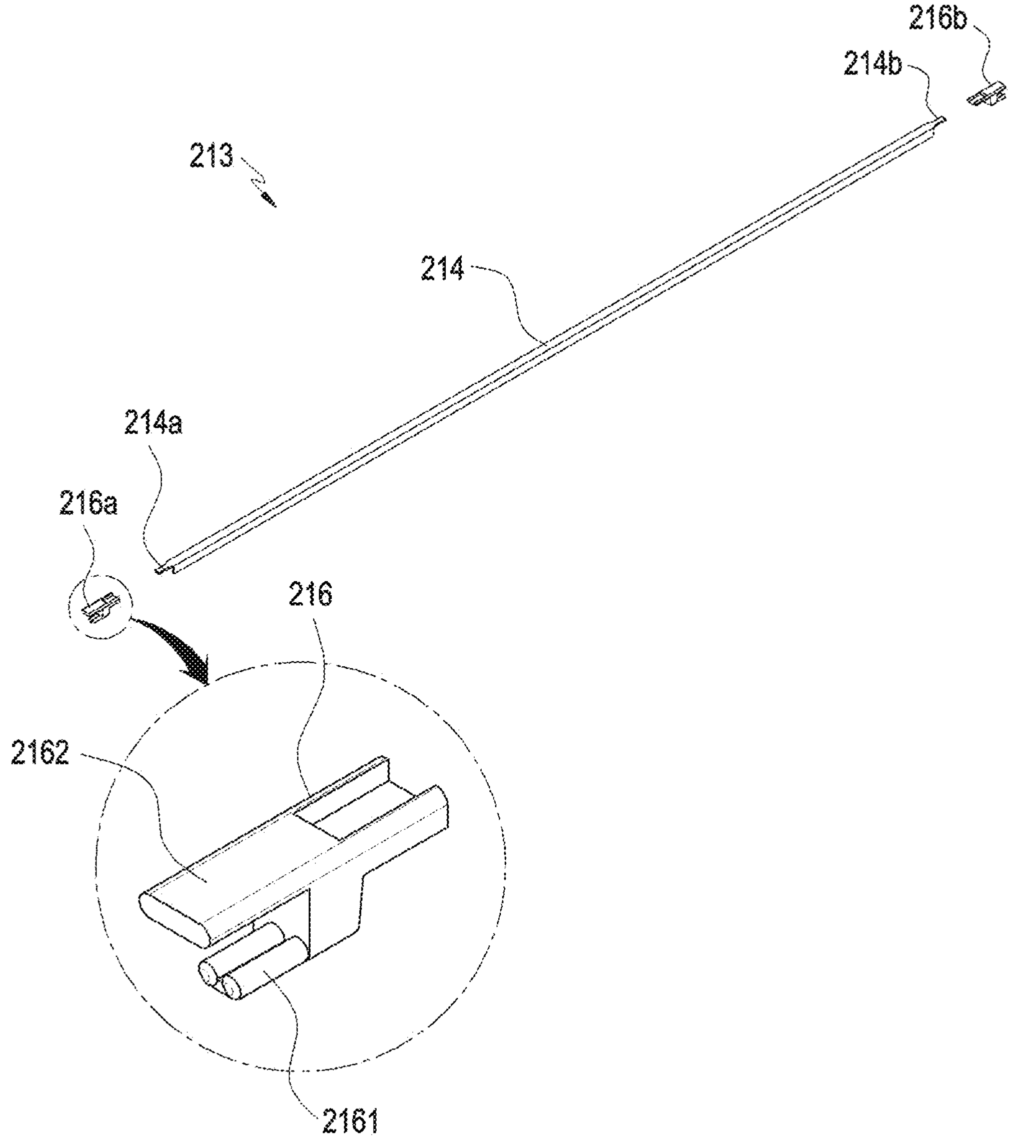
FIG. 5 is an enlarged perspective view illustrating a display support member according to various embodiments.

FIG. 5 is a perspective view including an enlarged perspective view illustrating a display support member according to various embodiments.

Referring to FIGS. 4 and 5, the multi-bar structure 213 may include a rod 214 and a head portion 216 connected to the rod 214. The configuration of the rod 214 of FIG. 5 may be entirely or partially the same as the configuration of the rod 214 of FIG. 4.

According to an embodiment, the head portion 216 may be connected to both ends of the rod 214. For example, the rod 214 may include a first end **214*a* facing the upper guide rail and a second end 214*b* opposite to the first end 214*a* and facing the lower guide rail. The head portion 216 may include a first head portion 216*a* connected to the first end 214*a* and a second head portion 216*b* connected to the second end 214*b***.

According to an embodiment, at least a portion of the head portion 216 may receive a force from the guide rail 215 and move based on a movement of the guide rail 215. For example, at least a portion of the head portion **216*a* may include an insertion area 2161 configured to be inserted into the rail 215*a* of the guide rail 215 and a protective area 2162 facing the outer surface of the guide rail 215. According to an embodiment, the head portion 216 may move along the rail 215*a* while the insertion area 2161 is engaged with the rail 215*a*. According to an embodiment, when the electronic device 101 performs a slide-in operation, the head portion 216 may receive a force and/or a pressure from an outer portion of the guide rail 215. According to an embodiment, when the electronic device 101 performs a slide-out operation, the head portion 216 may receive a force and/or pressure from the protrusion 215*b* of the guide rail 215**.

Figure 6:
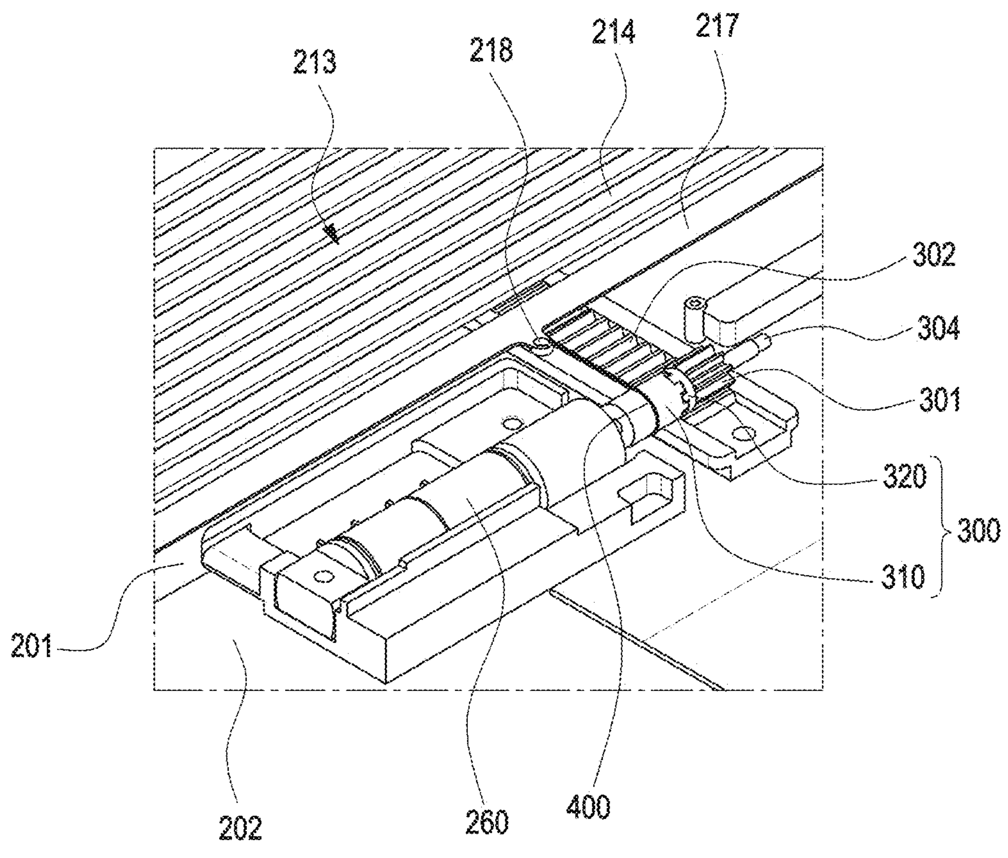
FIG. 6 is a partial perspective view illustrating an internal structure of an electronic device according to various embodiments.
Figure 7:
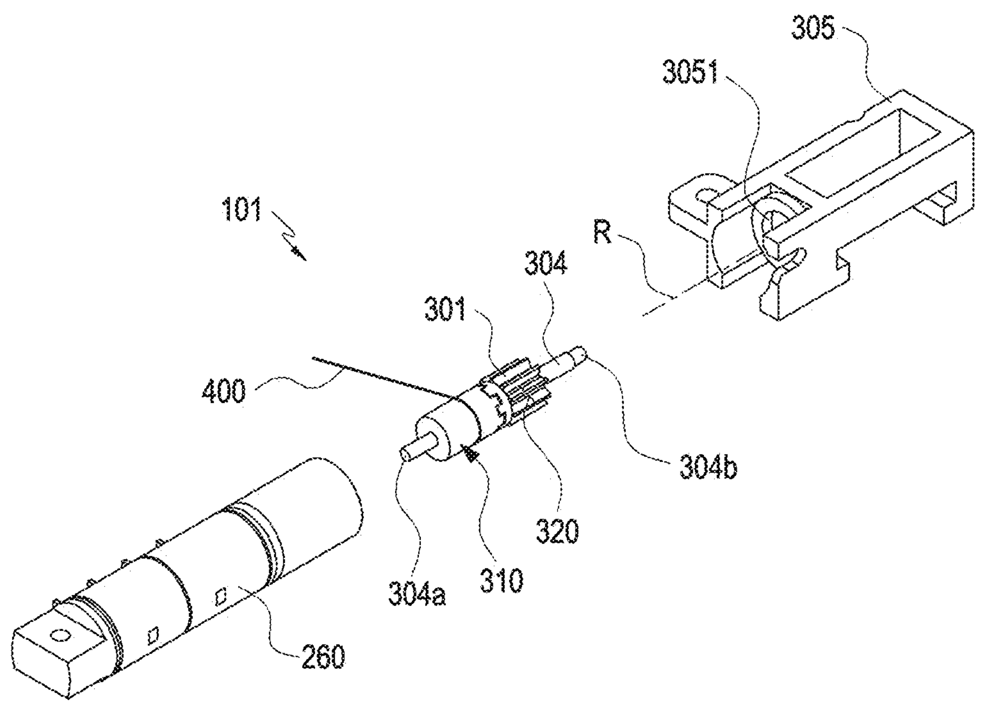
FIG. 7 is a partial perspective view illustrating an electronic device including a motor structure, a gear structure, and a wire structure according to various embodiments.

FIG. 6 is a partial perspective view illustrating an internal structure of an electronic device according to various embodiments. FIG. 7 is an exploded perspective view illustrating an electronic device including a motor structure, a gear structure, and a wire structure according to various embodiments.

Referring to FIGS. 6 and 7, the electronic device 101 may include a first housing 201, a second housing 202, a multi-bar structure 213, a motor structure 260, a gear structure 300, and/or a wire structure 400. The configuration of the first housing 201, the second housing 202, the multi-bar structure 213, and the motor structure 260 of FIGS. 6 and/or 7 may be entirely or partially the same as the configuration of the first housing 201, the second housing 202, the multi-bar structure 213, and the motor structure 260 of FIGS. 4 and/or 5.

According to an embodiment, the multi-bar structure 213 may include an end bar 217 positioned at the end of the multi-bar structure 213. According to an embodiment, the end bar 217 may be defined as a rod 214 located at the outermost edge of the rods 214 of the multi-bar structure 213.

According to an embodiment, the multi-bar structure 213 may include a fastening region 218 for accommodating the wire structure 400. According to an embodiment, the fastening region 218 may extend from the end bar 217. According to an embodiment, the fastening region 218 may provide a through-hole or an empty space to connect with at least a portion of the wire structure 400.

According to an embodiment, the motor structure 260 may generate power for the sliding of the electronic device 101. For example, the motor structure 260 may include a motor core capable of converting electrical energy into kinetic energy (e.g., rotational energy). According to an embodiment, the rotational energy generated by the motor structure 260 may rotate a pinion gear 301 and/or a gear shaft 304 connected to the wire structure 400.

According to an embodiment, the motor structure 260 may be controlled by a processor (e.g., the processor 120 of FIG. 1). For example, the processor 120 may include a motor driver driving circuit, and may provide a pulse width modulation (PWM) signal for controlling the speed of the motor structure 260 and/or the torque of the motor structure 260 to the motor structure 260. According to an embodiment, the motor structure 260 may be electrically connected to a processor (e.g., the processor 120 of FIG. 1) positioned on a circuit board (e.g., the circuit board 204 of FIG. 4) using a flexible printed circuit board.

According to an embodiment, the gear structure 300 may transfer at least a portion of the driving force generated by the motor structure 260 to the first housing 201 and/or the second housing 202. For example, the gear structure 300 may include a pinion gear 301 (e.g., a first gear) and a rack gear 302 (e.g., a second gear) configured to be engaged with the pinion gear 301. The pinion gear 301 and/or the rack gear 302 may transmit a driving force for a slide-in operation and/or a slide-out operation of the electronic device 101 to the first housing 201 and/or the second housing 202. According to an embodiment, the first housing 201 may move relative to the second housing 202 using the motor structure 260, the pinion gear 301, and/or the rack gear 302.

According to an embodiment, the pinion gear 301 may rotate based on the rotation of the motor core of the motor structure 260. The pinion gear 301 may be connected to the motor structure 260 using the gear shaft 304. According to an embodiment, when the slide-out operation and/or the slide-in operation of the electronic device 101 is performed, the pinion gear 301 may rotate about the gear shaft 304. According to an embodiment, the pinion gear 301 may be a spur gear. According to an embodiment, the pinion gear 301 may mesh with the rack gear 302.

According to an embodiment, the rack gear 302 may be connected to a housing different from the motor structure 260. For example, the rack gear 302 may be connected to the second housing 202, and the motor structure 260 may be connected to the first housing 201. According to an embodiment, when the pinion gear 301 rotates due to the driving force generated by the motor structure 260, the motor structure 260 and the pinion gear 301 may move relative to the rack gear 302. According to an embodiment, the rack gear 302 may be connected to a portion (e.g., the second plate 221 of FIG. 4) of the second housing 202, and the motor structure 260 may be connected to a portion (e.g., the first plate 211 of FIG. 4) of the first housing 201. According to an embodiment, the motor structure 260 may be connected to a portion (e.g., the second plate 221 of FIG. 4) of the second housing 202, and the rack gear 302 may be connected to a portion (e.g., the first plate 211 of FIG. 4) of the first housing 201.

According to an embodiment, the gear structure 300 may include a gear shaft 304 configured to rotate based on a driving force generated by the motor structure 260. According to an embodiment, the gear shaft 304 may be connected to the motor structure 260 and may provide a rotation axis R that is substantially perpendicular to the slide direction of the electronic device 101. According to an embodiment, the gear shaft 304 may include a first shaft end **304*a* connected to the motor structure 260 and a second shaft end 304*b* that is opposite to the first shaft end 304*a* and rotatably connected to the gear housing 206**.

According to an embodiment, the gear structure 300 may include a gear housing 305 that accommodates at least a portion of the gear shaft 304. For example, the gear housing 305 may include an opening 3051 that accommodates the second shaft end **304*b* of the gear shaft 304. The gear shaft 304 may be rotatably connected to the gear housing 305**.

According to an embodiment, the gear structure 300 may be connected to the wire structure 400. For example, the gear structure 300 may include a first region 310 facing the wire structure 400 and a second region 320 connected to the pinion gear 301. According to an embodiment, the first region 310 may be connected to the gear shaft 304. For example, the first region 310 may rotate based on the rotation of the gear shaft 304. According to an embodiment, the first region 310 may be connected to the wire structure 400. The wire structure 400 may be rolled around the first region 310 based on the rotation of the first region 310. According to an embodiment, the second region 320 may rotate based on the rotation of the first region 310. For example, the second region 320 may mesh with the first region 310 and rotate based on the driving force of the motor received from the first region 310. The pinion gear 301 may rotate together with the second region 320. According to an embodiment, the second region 320 may be directly connected to the gear shaft 304 and may rotate based on the rotation of the motor structure 260 through the gear shaft 304. According to an embodiment, the pinion gear 301 may be referred to as a part of the second region 320.

According to an embodiment, the first region 310 and the second region 320 may rotate about substantially the same axis. For example, the first region 310 and the second region 320 may rotate about the rotation axis R provided by the gear shaft 304.

According to an embodiment, the wire structure 400 may provide a driving force for moving the display 203 to the display support member 230. According to an embodiment, the wire structure 400 may be connected to the gear structure 300 and the multi-bar structure 213. For example, one end of the wire structure 400 may be connected to the end bar 217 of the multi-bar structure 213, and the other end thereof may be connected to the first region 310 of the gear structure 300. According to an embodiment, the wire structure 400 may be connected to the fastening region 218.

According to an embodiment, the wire structure 400 may transmit at least some of the driving force generated by the motor structure 260 to the multi-bar structure 213 and/or the first housing 201. For example, when the electronic device 101 performs a slide-in operation, at least a portion of the wire structure 400 may transfer a force and/or pressure to the multi-bar structure 213 while rolling about the rotation axis R.

Figure 8A:
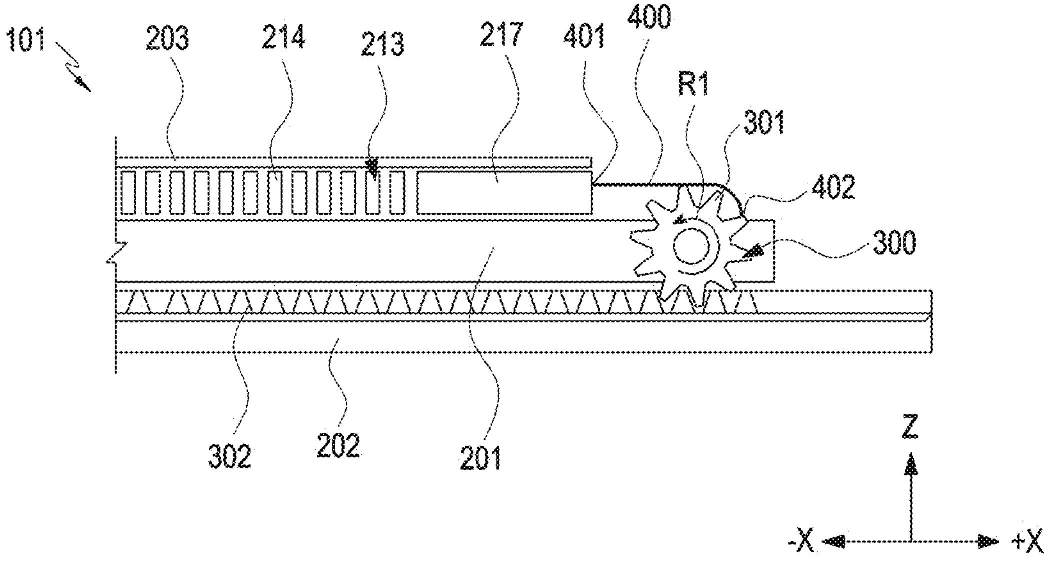
FIGS. 8A and 8B are diagrams illustrating side views of an electronic device according to various embodiments.
Figure 8B:
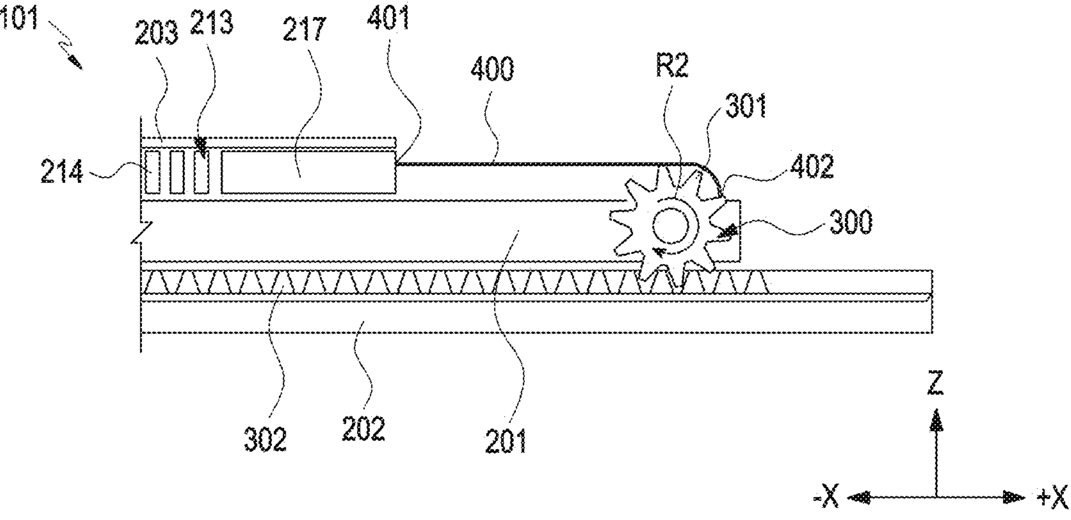
Figure 9A:
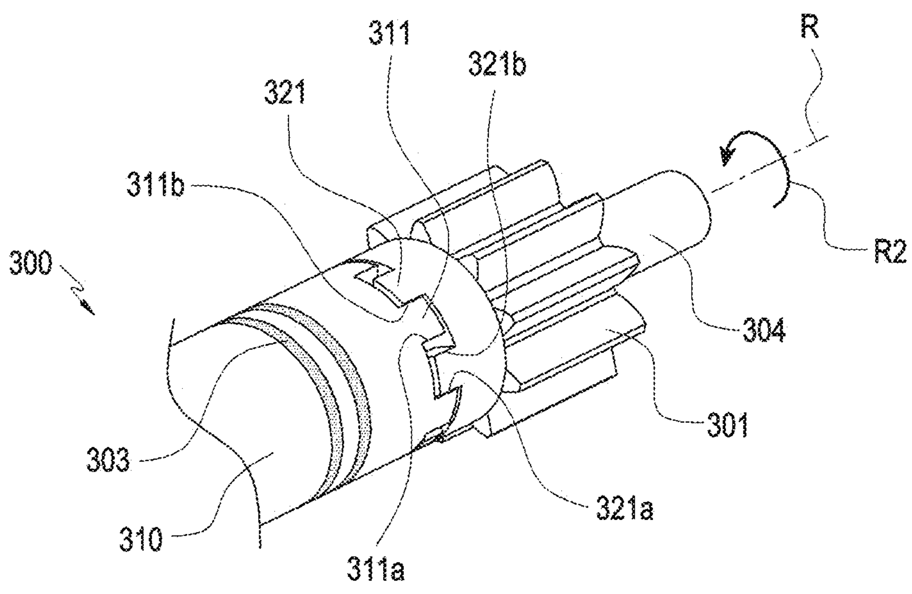
FIG. 9A and FIG. 9B are partial perspective views illustrating a gear structure according to various embodiments.
Figure 9B:
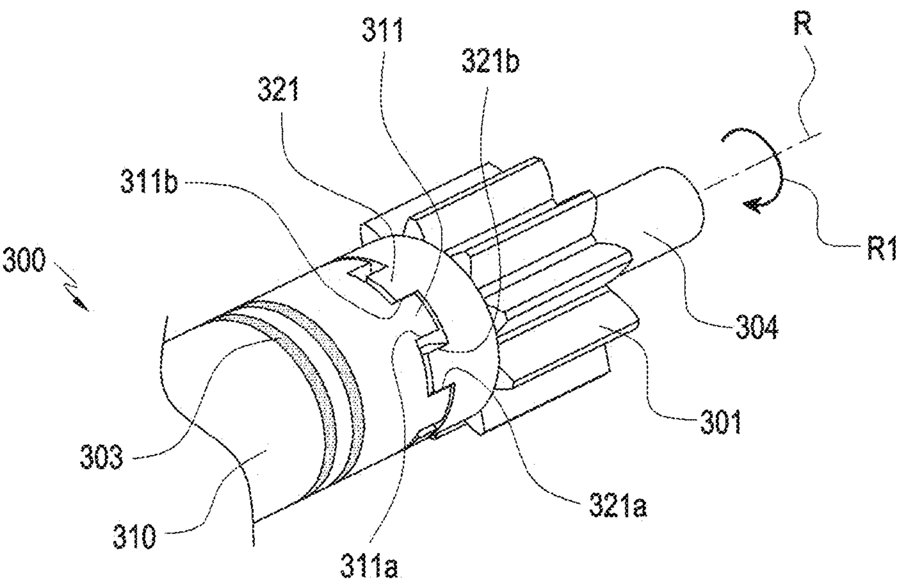

FIGS. 8A and 8B are diagrams illustrating side views of an electronic device according to various embodiments. For example, FIG. 8A is a side view of an electronic device in a slide-out operation, and FIG. 8B is a diagram illustrating a side view of an electronic device in a slide-in operation according to various embodiments. FIGS. 9A and 9B are partial perspective views illustrating a gear structure according to various embodiments. For example, FIG. 9A is a perspective view of a gear structure for describing a slide-out operation, and FIG. 9B is a perspective view of a gear structure for describing a slide-in operation according to various embodiments.

Referring to FIGS. 8A and 8B, 9A, and/or 9B, the electronic device 101 may include a first housing 201, a second housing 202, a display 203, a multi-bar structure 213, a gear structure 300, and a wire structure 400. The configuration of the first housing 201, the second housing 202, the display 203, the multi-bar structure 213, the gear structure 300, and the wire structure 400 of FIGS. 8A, 8B, 9A, and/or 9B may be entirely or partially the same as the configuration of the first housing 201, the second housing 202, the display 203, the multi-bar structure 213, the gear structure 300, and the wire structure 400 of FIGS. 4 and/or 6.

According to an embodiment, the electronic device 101 may perform a slide-out operation and/or a slide-in operation.

Referring to FIG. 8A, when the pinion gear 301 of the gear structure 300 rotates in the first rotation direction R1, the electronic device 101 may perform a slide-out operation. For example, when the pinion gear 301 rotates in the first rotation direction R1 while being engaged with the rack gear 302, the first housing 201 may move in the first direction (e.g., the −X direction) with respect to the second housing 202, and at least a portion of the display 203 and at least a portion of the multi-bar structure 213 may be unfolded. When the electronic device 101 may perform a slide-out operation, at least a portion of the wire structure 400, rolled on the gear structure 300, may be released.

Referring to FIG. 8B, when the gear structure 300 rotates in the second rotation direction R2, the electronic device 101 may perform a slide-in operation. For example, when the pinion gear 301 rotates in the second rotation direction R2, which is opposite to the first rotation direction R1, while being engaged with the rack gear 302, the first housing 201 may move in the second direction (e.g., the +X direction) with respect to the second housing 201, and at least a portion of the display 203 and at least a portion of the multi-bar structure 213 may be rolled. When the electronic device 101 performs a slide-in operation, at least a portion of the wire structure 400 may be rolled in the gear structure 300.

According to an embodiment, the second region 320 may rotate sequentially or stepwise with respect to the first region 310. For example, after the first region 310 has rotated in the first rotation direction R1 or the second rotation direction R2, the second region 320 may rotate in the same direction as the first region 310. According to an embodiment, the gear structure 300 may rotate in the first rotation direction R1 or the second rotation direction R2 with respect to the gear shaft 304 and/or the rotation axis R.

According to an embodiment, when the electronic device 101 performs a slide-in operation, the display 203 may receive a force and/or pressure via the wire structure 400, and subsequently may receive a force and/or pressure from the pinion gear 301. For example, the multi-bar structure 213, via the wire structure 400 connected to the first region 310, may receive a force in the second direction (+X direction). Then, using the pinion gear 301 and/or the rack gear 302, the multi-bar structure 213 may receive the force from the guide rail (e.g., the guide rail 215 of FIG. 4) in the second direction (e.g., +X direction).

According to an embodiment, the first region 310 may include at least one first gear tooth 311. The second region 320 may include at least one second gear tooth 321 configured to be engaged with the first gear tooth 311. According to an embodiment, the first gear tooth 311 may include a first gear surface 311*a* and a second gear surface 311*b* opposite to the first gear surface 311*a*. The second gear tooth 321 may include a third gear surface 321*a* and a fourth gear surface 321*b* opposite to the third gear surface 321*a*. According to an embodiment, when the gear structure 300 rotates in the first rotation direction R1, the second gear surface 311*b* of the first gear tooth 311 may contact the third gear surface 321*a* of the second gear tooth 321. According to an embodiment, when the gear structure 300 rotates in the second rotation direction R2, the first gear surface 311*a* of the first gear tooth 311 may contact the fourth gear surface 321*b* of the second gear tooth 321.

According to an embodiment, the first gear tooth 311 and the second gear tooth 321 may protrude in a direction perpendicular to the pinion gear 301. For example, the pinion gear 301 may include a gear protruding in a direction perpendicular to the rotation axis R, and the first gear tooth 311 and/or the second gear tooth 321 may protrude in a direction substantially parallel to the rotation axis R.

According to an embodiment, the gear structure 300 may include an accommodation groove 303 to accommodate at least a portion of the wire structure 400. For example, the accommodation groove 303 may be an empty space formed in the first region 310 of the gear structure 300. According to an embodiment, the accommodation groove 303 may reduce the twisting of the wire structure 400.

According to an embodiment, the wire structure 400 may be connected to the multi-bar structure 213 and the gear structure 300. For example, the wire structure 400 may include a first wire end 401 connected to the multi-bar structure 213 and a second wire end 402 connected to the first region 310 of the gear structure 300. According to an embodiment, the second wire end 402 may be connected to the accommodation groove 303.

According to an embodiment, the first region 310 and the second region 320 may be fastened to the gear shaft 304, and the first region 310 may rotate substantially simultaneously with the second region 320.

Figure 10:
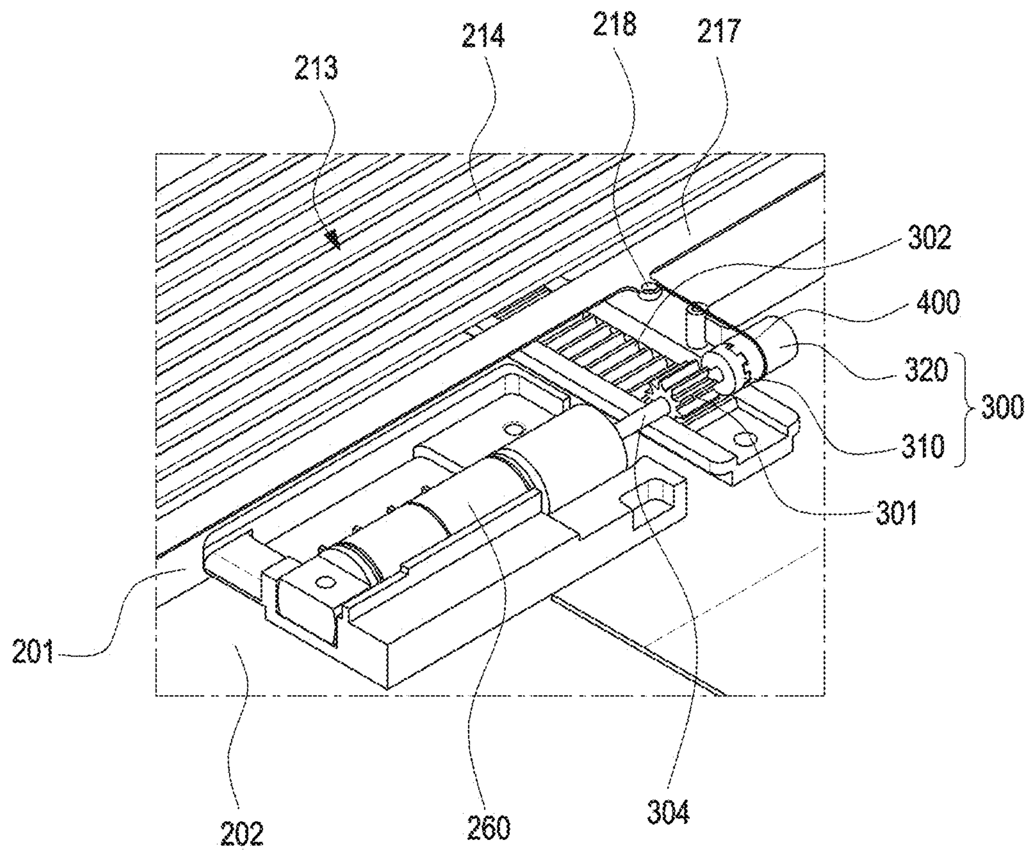
FIG. 10 is a partial perspective view illustrating an electronic device including a motor structure, a gear structure, and a wire structure according to various embodiments.

FIG. 10 is a partial perspective view illustrating an electronic device including a motor structure, a gear structure, and a wire structure according to various embodiments.

Referring to FIG. 10, an electronic device 101 may include a first housing 201, a second housing 202, a multi-bar structure 213, a motor structure 260, a gear structure 300, and/or a wire structure 400. The configuration of the first housing 201, the second housing 202, the multi-bar structure 213, the motor structure 260, the gear structure 300, and the wire structure 400 of FIG. 10 may be entirely or partially the same as the configuration of the first housing 201, the second housing 202, the multi-bar structure 213, the motor structure 260, the gear structure 300, and the wire structure 400 of FIG. 6.

According to an embodiment, the shape of the gear structure 300 may be changed according to the design of the electronic device 101. According to an embodiment, the second region 320 may be disposed between the first region 310 and the motor structure 260. For example, the pinion gear 301 and/or the rack gear 302 may be positioned between the wire structure 400 and the motor structure 260.

According to an embodiment (not illustrated), the first region 310 of the gear structure 300 may be separated from the second region 320. For example, the first region 310 may be positioned in front of the motor structure 260, and the second region 320 may be positioned in the rear of the motor structure 260. The motor structure 260 may be disposed between the first region 310 and the second region 320.

Figure 11:
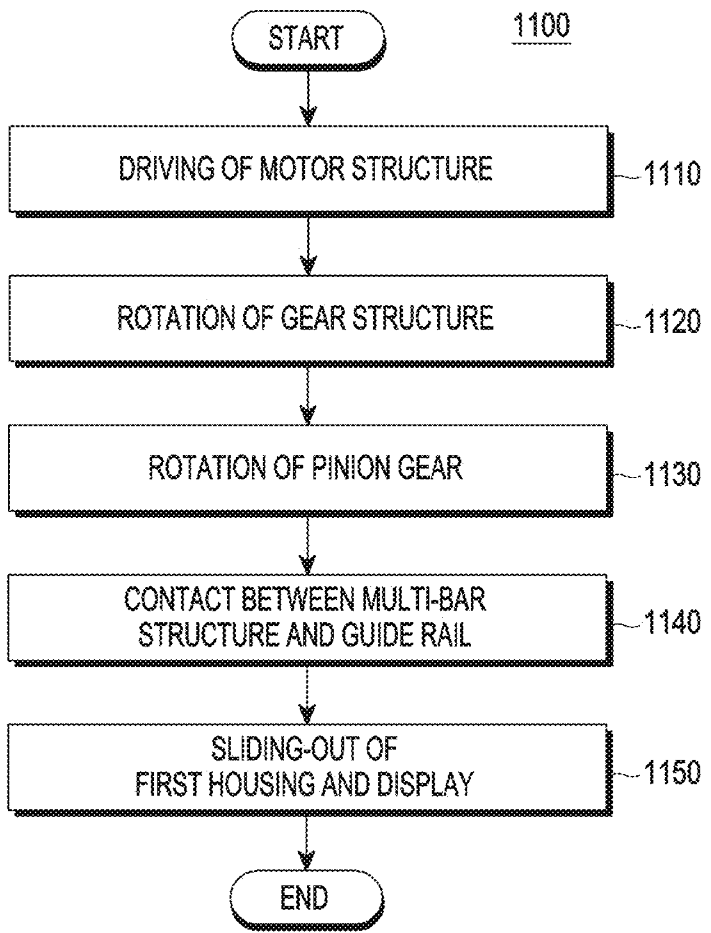
FIG. 11 is a flowchart illustrating an example slide-out operation of an electronic device according to various embodiments.
Figure 12:
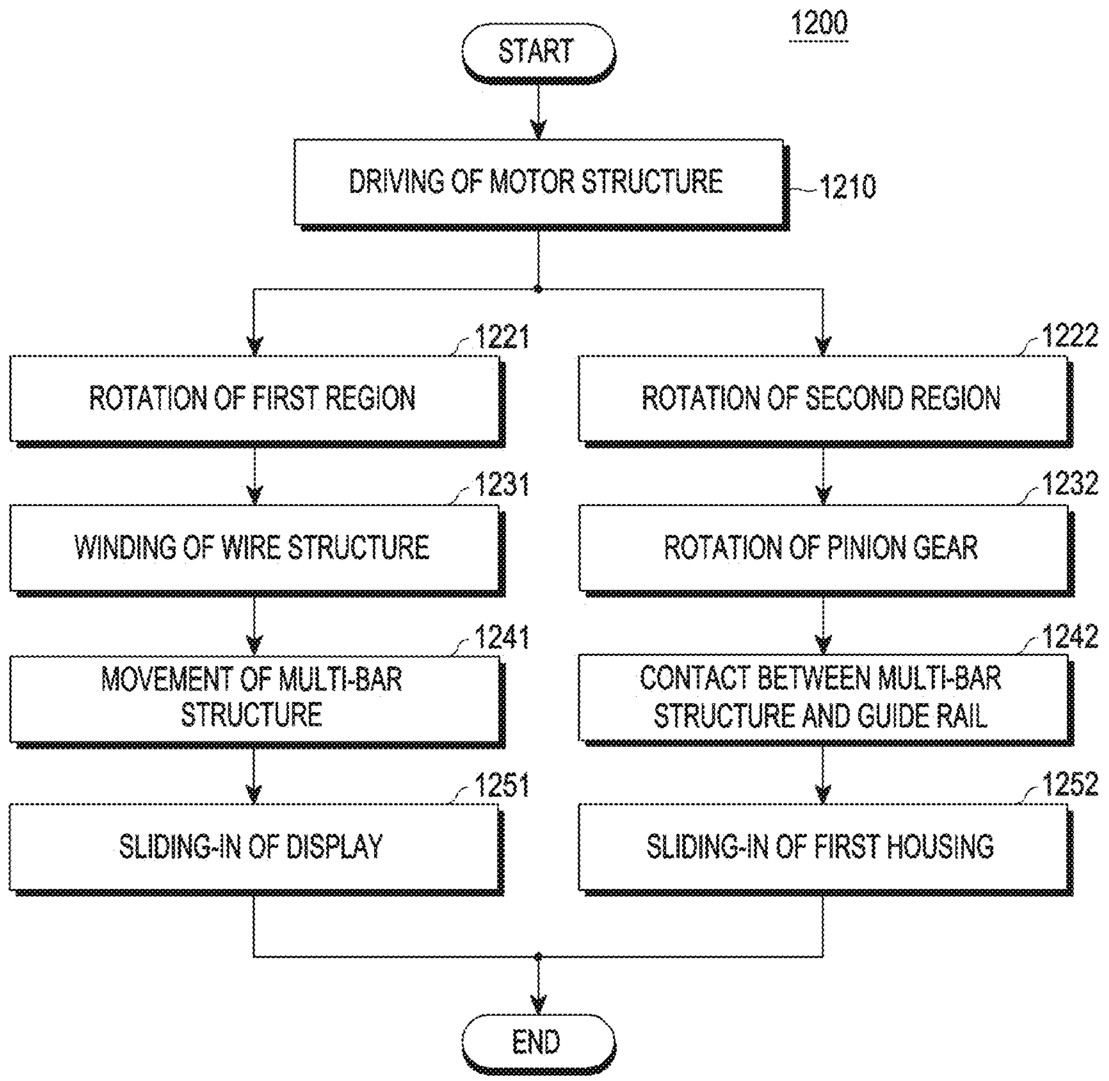
FIG. 12 is a flowchart illustrating an example slide-in operation of an electronic device according to various embodiments.

FIG. 11 is a flowchart illustrating an example slide-out operation of an electronic device according to various embodiments. FIG. 12 is a flowchart illustrating an example slide-in operation of an electronic device according to various embodiments.

Referring to FIG. 11, a slide-out operation 1100 of the electronic device 101 may include an operation 1110 of driving the motor structure 260, an operation 1120 of rotating the gear structure 300, an operation 1130 of rotating the pinion gear 301, an operation 1140 of contacting the multi-bar structure 213 with the guide rail 215, and an operation 1150 of pulling or sliding out the first housing 201 and the display 203. According to an embodiment, when the gear structure 300 rotates due to the driving of the motor structure 260 in operations 1110, 1120, and 1130, the pinion gear 301 may rotate together with the second region (e.g., the second region 320 of FIG. 6) of the gear structure 300. According to an embodiment, during operations 1140 and 1150, the insertion area 2161 of the head portion (e.g., the head portion 216 of FIG. 5) of the multi-bar structure 213 may contact the guide rail 215. For example, when the first housing 201 performs a slide-out operation, the guide rail 215 may provide pressure to the insertion area 2161 of the multi-bar structure 213 while moving together with the first housing 201. When the first housing 201 is pulled out, the display 203 may be unfolded based on the movement of the guide rail 215 and the multi-bar structure 213.

Referring to FIG. 12, a slide-in operation 1200 of the electronic device 101 may include an operation 1210 of driving the motor structure 260, an operation 1221 of rotating the first region 310, an operation 1222 of rotating the second region 320, an operation 1231 of winding the wire structure 400, an operation 1232 of rotating the pinion gear 301, an operation 1241 of moving the multi-bar structure 213, an operation 1242 of contacting the multi-bar structure 213 with the guide rail 215, an operation 1251 of retracting or sliding in the display 203, and an operation 1252 of retracting or sliding in the first housing 201. According to an embodiment, during operations 1210, 1221, 1222, 1231, and 1232, the first region 310 and the second region 320 of the gear structure 300 may rotate by driving the motor structure 260. The wire structure 400 connected to the first region 310 may be rolled around the first region 310 based on rotation of the first region 310. The pinion gear 301 connected to the second region 320 may rotate based on rotation of the second region 320. According to an embodiment, the first region 310 may rotate before the second region 320.

According to an embodiment, with reference to operations 1241, 1242, 1251, and 1252, the multi-bar structure 213 may receive a force and/or pressure via the wire structure 400 and/or the guide rail 215. For example, the multi-bar structure 213 may move based on the winding of the wire structure 400. For example, the head portion 216 of the multi-bar structure 213 may receive a force and/or pressure from the guide rail 215. According to an embodiment, when the first housing 201 is slid in, the display 203 may unfold based on the movement of the wire structure 400, the guide rail 215, and the multi-bar structure 213.

According to an embodiment, when the electronic device 101 performs a slide-in operation, the contact between the head portion 216 and the guide rail 215 may provide concentrated stress to the area in which the display 203 is bent. As the multi-bar structure 213 receives the force from the wire structure 400, the force transmitted from the guide rail 215 to the head portion 216 may be reduced when the electronic device (e.g., the electronic device 101 of FIG. 2) performs a slide-in operation. As the concentrated stress provided to the display 203 is reduced due to the wire structure 400, damage to the display 203 may be reduced.

The configuration of the first housing 201, the display 203, the multi-bar structure 213, the guide rail 215, the motor structure 260, the gear structure 300, the first region 310, the second region 320, and the wire structure 400 of FIGS. 11 and/or 12 may be entirely or partially the same as the configuration of the first housing 201, the display 203, the multi-bar structure 213, the guide rail 215, the motor structure 260, the gear structure 300, the first region 310, the second region 320, and the wire structure 400 of FIGS. 4 and/or 6.

An electronic device (e.g., a portable terminal) may include a display in the form of a flat surface or flat and curved surfaces. Due to the fixed structure of the display, an electronic device including a display may face limitations in implementing a screen larger than the size of the electronic device. Consequently, there is ongoing research on electronic devices including a rollable display.

A rollable electronic device may include a guide rail to transmit a force for unfolding or rolling a rollable display. For example, a display support member attached to the rollable display may be unfolded or rolled by sliding the guide rail together with the housing. However, when the electronic device performs a slide-in operation using the guide rail, stress may be concentrated on certain areas of the display, leading to damage to the display.

According to an embodiment of the disclosure, it is possible to provide an electronic device capable of rolling a display using a wire structure and a guide rail during a slide-in operation of the electronic device.

However, the problems to be addressed in the disclosure are not limited to the above-mentioned problems, and may be variously expanded without departing from the spirit and scope of the disclosure.

According to an embodiment of the disclosure, the electronic device may reduce the stress applied to the display during the slide-in operation of the electronic device using the wire structure. As the concentration stress applied to the bending portion of the display is reduced, damage to the display may be reduced.

Additionally, various effects that are directly or indirectly discerned through this disclosure may be provided.

According to an example embodiment of the disclosure, an electronic device (e.g., the electronic device 101 of FIG. 3) includes: a housing (e.g., the housing 200 of FIG. 3) including a first housing (e.g., the first housing 201 of FIG. 3) and a second housing (e.g., the second housing 202 of FIG. 3) configured to accommodate at least a portion of the first housing and move relative to the first housing, a display (e.g., the display 203 of FIG. 3) configured to be unfolded based on a sliding movement of the housing, a multi-bar structure (e.g., the multi-bar structure 213 of FIG. 4) comprising a plurality of rods configured to support at least a portion of the display, and a motor structure (e.g., the motor structure 260 of FIG. 4) comprising a motor disposed in the housing and configured to generate a driving force for a sliding movement of the housing, a gear structure (e.g., the gear structure 300 of FIG. 6) including a pinion gear (e.g., the pinion gear 301 of FIG. 6) configured to rotate based on the driving force, and a wire structure (e.g., the wire structure 400 of FIG. 4) comprising a wire connected to the multi-bar structure and the gear structure.

According to an example embodiment, the gear structure may include a first region (e.g., the first region 310 of FIG. 7) facing the wire structure and a second region (e.g., the second region 320 of FIG. 7) connected to the pinion gear, wherein the second region may be configured to rotate based on the rotation of the first region.

According to an example embodiment, the first region may include a first gear tooth (e.g., the first gear tooth 311 of FIG. 9A), and the second region may include a second gear tooth (e.g., the second gear tooth 321 of FIG. 9A) configured to be engaged with the first gear.

According to an example embodiment, the first gear tooth and the second gear tooth may protrude in a direction perpendicular to the pinion gear.

According to an example embodiment, the first region may be positioned between the second region and the motor structure.

According to an example embodiment, the first region and the second region may be spaced apart from each other, and the motor structure may be disposed between the first region and the second region.

According to an example embodiment, the first region may be configured to rotate before or simultaneously with the second region.

According to an example embodiment, the gear structure may include a rack gear (e.g., the rack gear 302 of FIG. 6) connected to the second housing and configured to be engaged with the pinion gear, and the motor structure may be connected to the first housing.

According to an example embodiment, the multi-bar structure may include a plurality of rods (e.g., the rods 214 of FIG. 5) and a head portion (e.g., the head portion 216 of FIG. 5) connected to an end of the plurality of rods (e.g., the first end 214*a* or the second end 214*b* of FIG. 5).

According to an example embodiment, the plurality of rods may include an end bar (e.g., the end bar 217 of FIG. 6) positioned at the end of the multi-bar structure, and the end bar may include a fastening region (e.g., the fastening region 218 of FIG. 6) connected to the wire structure.

According to an example embodiment, the first housing may include a guide rail (e.g., the guide rail 215 of FIG. 4) which includes a rail (e.g., the rail 215*a* of FIG. 4) configured to accommodate at least a portion of the head portion and a protrusion (e.g., the protrusion 215*b* of FIG. 4) at least partially surrounded by the rail.

According to an example embodiment, the gear structure may include an accommodation groove (e.g., the accommodation groove 303 of FIG. 9A) that accommodates at least a portion of the wire structure.

According to an example embodiment, the gear structure may include a gear shaft (e.g., the gear shaft 304 of FIG. 7) connected to the motor structure and configured to provide a rotation axis (e.g., the rotation axis R of FIG. 7), the pinion gear may be configured to rotate along the rotation axis, and the wire structure may be configured to roll about the rotation axis.

According to an example embodiment, the wire structure may include a first wire end (e.g., the first wire end 401 of FIG. 8A) connected to the multi-bar structure and a second wire end (e.g., the second wire end 402 of FIG. 8A) opposite to the first wire end and connected to the gear structure.

According to an example embodiment, the display may include a first display area (e.g., the first display area A1 of FIG. 3) connected to the second housing and a second display area (e.g., the second display area A2 of FIG. 3) extending from the first display area and at least partially connected to the multi-bar structure.

It will be apparent to one of ordinary skill in the art that the electronic device including the wire structure according to the disclosure as described above is not limited to the above-described embodiments and those shown in the drawings, and various changes, modifications, or alterations may be made thereto without departing from the scope of the present disclosure, including the appended claims and their equivalents. It will also be understood that any of the embodiment(s) described herein may be used in conjunction with any other embodiment(s) described herein.

What is claimed is:

1. An electronic device comprising:

a housing including a first housing and a second housing configured to accommodate at least a portion of the first housing and to move relative to the first housing;

a display configured to be unfolded based on a sliding movement of the housing;

a multi-bar structure, comprising a plurality of rods, configured to support at least a portion of the display;

a motor structure comprising a motor disposed in the housing and configured to generate a driving force for the sliding movement of the housing;

a gear structure, including a pinion gear, configured to rotate based on the driving force; and a wire structure, comprising a wire, connected to the multi-bar structure and the gear structure, wherein the multi-bar structure comprises a plurality of rods, wherein the plurality of rods comprises an end bar positioned at an end of the multi-bar structure, and wherein the end bar comprises a fastening region connected to the wire structure.

2. The electronic device of claim 1, wherein the gear structure comprises a first region facing the wire structure and a second region connected to the pinion gear, wherein the second region is configured to rotate based on rotation of the first region.

3. The electronic device of claim 2, wherein the first region comprises a first gear tooth, and the second region comprises a second gear tooth configured to be engaged with the first gear tooth.

4. The electronic device of claim 3, wherein the first gear tooth and the second gear tooth protrude in a direction perpendicular to the pinion gear.

5. The electronic device of claim 2, wherein the first region is positioned between the second region and the motor structure.

6. The electronic device of claim 2, wherein the first region and the second region are spaced apart from each other, and wherein the motor structure is disposed between the first region and the second region.

7. The electronic device of claim 1, wherein the gear structure comprises a rack gear connected to the second housing and configured to be engaged with the pinion gear, and wherein the motor structure is connected to the first housing.

8. The electronic device of claim 1, wherein the multi-bar structure comprises a head portion connected to an end of the plurality of rods.

9. The electronic device of claim 1, wherein the first housing comprises a guide rail including a rail configured to accommodate at least a portion of the head portion and a protrusion at least partially surrounded by the rail.

10. The electronic device of claim 1, wherein the gear structure comprises an accommodation groove configured to accommodate at least a portion of the wire structure.

11. The electronic device of claim 1, wherein the gear structure comprises a gear shaft connected to the motor structure and configured to provide a rotation axis, wherein the pinion gear is configured to rotate along the rotation axis, and wherein the wire structure is configured to be rolled around the rotation axis.

12. The electronic device of claim 1, wherein the wire structure comprises a first wire end connected to the multi-bar structure and a second wire end opposite to the first wire end and connected to the gear structure.

13. The electronic device of claim 1, wherein the display comprises a first display area connected to the second housing and a second display area extending from the first display area and at least partially connected to the multi-bar structure.

14. The electronic device of claim 1, wherein the gear structure comprises a first region facing the wire structure and a second region connected to the pinion gear, wherein the second region is configured to rotate based on rotation of the first region, and wherein the second region is configured to rotate sequentially and/or stepwise with respect to the first region such that, after the first region has rotated in a first rotation direction and/or a second rotation direction, the second region rotates in the same direction as the first region.

* * * * *